United States Patent [19]

Schulz

[11] Patent Number: 4,901,126
[45] Date of Patent: Feb. 13, 1990

[54] RADIATION DETECTOR

[75] Inventor: Reiner Schulz, Erlangen, Fed. Rep. of Germany

[73] Assignee: Siemens Aktiengesellschaft, Berlin and Munich, Fed. Rep. of Germany

[21] Appl. No.: 103,383

[22] Filed: Oct. 1, 1987

[30] Foreign Application Priority Data

Oct. 6, 1986 [DE] Fed. Rep. of Germany ....... 3633998

[51] Int. Cl.$^4$ ..................... G01T 1/24; H01L 29/06; H01L 29/12

[52] U.S. Cl. ..................................... 357/29; 357/55; 357/58

[58] Field of Search ............. 357/29, 30 D, 30 H, 58, 357/55; 250/370.14

[56] References Cited

U.S. PATENT DOCUMENTS

| 3,550,094 | 12/1970 | Norton | 357/29 |
| 3,691,389 | 9/1972 | Ellis et al. | 357/58 |
| 3,925,669 | 12/1975 | Glasow | 250/370 |
| 4,688,067 | 8/1987 | Rehak et al. | 357/29 |

FOREIGN PATENT DOCUMENTS

| 1812127 | 6/1970 | Fed. Rep. of Germany . |
| 2543065 | 3/1977 | Fed. Rep. of Germany . |
| 59-56773 | 2/1984 | Japan . |
| 60-78376 | 5/1985 | Japan . |

OTHER PUBLICATIONS

"Silicon Strip Detectors With Capacitive Charge Division," Koetz et al., Nuclear Instruments & Methods in Physics Research, Koetz et al., A235, No. 3, Apr. 1985, pp. 481, 487.

Primary Examiner—Gene M. Munson
Attorney, Agent, or Firm—Hill, VanSanten, Steadman & Simpson

[57] ABSTRACT

A radiation detector has a number of detector elements disposed following each other in the direction of incoming radiation propagation. The radiation detector is integrally constructed of a semiconductor body having spaced surfaces disposed substantially parallel to the radiation propagation direction. One of the surfaces has a p-conductive region immediately therebelow, and the other surface has an n-conductive region immediately therebelow. At least one of the surfaces is sub-divided by a region extending transversely to the radiation propagation direction which has a lower conductivity than the adjacent regions. This section divides the semiconductor body into different detector elements.

6 Claims, 1 Drawing Sheet

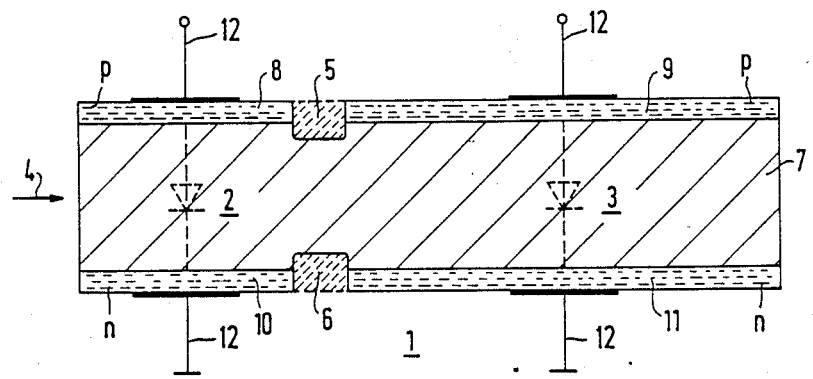

RADIATION DETECTOR

BACKGROUND OF THE INVENTION

1. Field of the Invention

The present invention is directed to a radiation detector having a plurality of detector elements arranged following each other in the direction of incoming radiation propagation, and wherein the radiation detector is integrally constructed from a semiconductor body.

2. Description of the Prior Art

Semiconductor radiation detectors may be used in a detector array of a computer tomograph for detecting x-radiation which has penetrated an examination subject. Detector elements which are disposed earliest in the direction of radiation propagation function as filters for following detector elements. The mean radiation energy of the received radiation can be identified from the output signals of the detector elements, which are individually acquired. It is also possible using such radiation detectors to undertake a correction according to the increase in radiation hardness in the exposure subject, a correction for the different spectral sensitivities of the detector elements, as well as a correction for the fluctuations of the mean energy of the spectrum emitted by the radiator, including the pre-filtering.

A radiation detector is disclosed in Japanese Patent Application No. 60-78376 consisting or a semiconductor body having spaced surfaces which proceed substantially parallel to the direction of radiation propagation. The semiconductor body is sub-divided into a plurality of detector elements by at least one section having a lower conductivity than the adjacent regions, which proceeds transversely relative to the radiation propagation direction. The region of lower conductivity is formed by an empty channel in one of the surfaces, the channel proceeding transversely relative to the radiation propagation direction. The individual detector elements of this known radiation detector function as radiation-sensitive resistors, i.e., resistors whose resistance value changes dependent on the intensity of the radiation. To enable detection of radiation, it is thus necessary to connect each of the individual detector elements to a voltage source, and to measure the current flowing through the detector elements. This is disadvantageous in practice.

SUMMARY OF THE INVENTION

It is an object of the present invention to provide a radiation detector constructed on a semiconductor body, wherein individual detector elements are formed by regions of lower conductivity disposed in surfaces of the semiconductor body, which can be operated voltage-free.

The above object is achieved in accordance with the principles of the present invention in a radiation detector consisting of a semiconductor body having spaced surfaces, with a p-conductive region disposed at one of the surfaces proceeding parallel to the radiation propagation direction, and an n-conductive region disposed at the opposite surface, also proceeding parallel to the radiation propagation direction. At least one of the regions is interrupted by a section having lower conductivity, the section extending transversely to the direction of radiation propagation. The individual detector elements are thus formed by radiation-sensitive diodes, which can be operated without the application of voltage thereto, because they supply a current or a voltage as a measure of the intensity of the radiation as soon as they receive the radiation. The voltage sources required in such radiation detectors in the prior art can thus be eliminated.

For tapping each of the individual detector elements, it is preferable to provide both the p-conductive and the n-conductive region with respective electrodes, with the section of lower conductivity dividing the electrodes into individual electrodes respectively associated with the individual detector elements. If only one of the regions is interrupted by the section of lower conductivity, the detector elements will have one terminal (at the un-interrupted region) which is shared by all of the detector elements. In a preferred embodiment, both regions of the semiconductor body are interrupted by respective regions of lower conductivity, and consequently the associated electrodes connected to the respective regions are interrupted as well, with the regions of lower conductivity in each of the p-conductive and n-conductive regions being in registry.

The section of lower conductivity may be formed by an empty channel, or by non-doped material.

DESCRIPTION OF THE DRAWINGS

The single FIGURE is a side sectional view of a radiation detector constructed in accordance with the principles of the present invention.

DESCRIPTION OF THE PREFERRED EMBODIMENTS

As shown in the drawing, a radiation detector 1 has two individual detector elements 2 and 3, which are formed by two semiconductor diodes as indicated schematically. Incoming radiation to be detected proceeds in the direction of the arrow 4, so that the detector elements 2 and 3 are disposed following each other in the radiation propagation direction. The radiation detector 1 is integrally constructed from a semiconductor body having two grooves 5 and 6 extending transversely to the radiation propagation direction. The grooves 5 and 6 divide the semiconductor body into the detector elements 2 and 3.

The semiconductor body of the radiation detector 1 consist of non-doped material such as, for example, germanium or silicon, having spaced surfaces extending substantially parallel to the direction of radiation propagation. One of the surfaces is doped so that a p-conductive region arises, and the opposite surface is doped so that an n-conductive region arises. These regions are subsequently interrupted by the grooves or channels 5 and 6, forming sections of lower conductivity in the respective regions. Two p-regions 8 and 9 and two n-regions 10 and 11 are thus generated on the semiconductor body, with a non-doped insulating region 7 therebetween. The regions 8, 9, 10 and 11 serve for signal reception in the manner shown in the drawing by forming the schematically indicated diodes.

Respective electrodes 12 are also applied to the surfaces, the electrodes 12 being sub-divided as well by the grooves 5 and 6. It is possible, however, to eliminate the groove 6 so that the n-conductive region is uninterrupted, in which case the electrode 12 for that region will be continuous as well and the individual detector elements will have a common connection to ground.

The grooves 5 and 6 may be empty, or may be filled with non-doped material corresponding to the material comprising the region 7 so as to provide the necessary region of lower conductivity for separating the two detector elements. The non-doped material filling the grooves 5 and 6 is indicated with dash-line shading.

Although modifications and changes may be suggested by those skilled in the art it is the intention of the inventor to embody within the patent warrented hereon all changes and modifications as reasonably and properly come within the scope of his contribution to the art.

I claim as my invention:

1. A detector for radiation arriving at an incoming radiation propagation direction, comprising:
   a semiconductor body having spaced surfaces disposed substantially parallel to the direction of radiation propagation;
   a region of first conductivity type disposed at one of said surfaces;
   a region of second conductivity type disposed at the other of said surfaces;
   a section of lower conductivity disposed in at least one of said regions and extending transversely to the direction of radiation propagation, said section of lower conductivity dividing said radiation detector into a plurality separate detector elements disposed following each other in the direction of incoming radiation propagation; and
   means attached to each of said regions for tapping an electrical signal from said individual detector elements.

2. A radiation detector as claimed in claim 1, wherein said region of first conductivity type is a p-region, and wherein said region of second conductivity type is a n-region, and wherein said section of lower conductivity is disposed in said p-region and wherein said n-region is uninterrupted.

3. A radiation detector as claimed in claim 1, wherein each of said regions has a section of lower conductivity therein, and wherein the respective sections of lower conductivity in said regions are disposed in registry.

4. A radiation detector as claimed in claim 1, wherein said region of lower conductivity comprises an empty groove in at least one of said regions.

5. A radiation detector as claimed in claim 1, wherein said section of lower conductivity comprises a groove filled with non-doped material in at least one of said regions.

6. A radiation detector comprising:
   a semiconductor body having spaced surfaces disposed substantially parallel to a direction of propagation of incoming radiation to be detected;
   a p-conductive region disposed at one of said surfaces;
   an n-conductive region disposed at the other of said surfaces;
   a first section of lower conductivity disposed in said p-conductive region;
   a second section of lower conductivity disposed in said n-conductive region, said first and second sections of lower conductivity being in registry and dividing said semiconductor body into a plurality of individual detector element; and
   electrode means attached to each of said p-conductive region and said n-conductive region for each of said individual detector elements.

* * * * *